United States Patent
Ito

(10) Patent No.: US 8,982,646 B2
(45) Date of Patent: Mar. 17, 2015

(54) SEMICONDUCTOR MEMORY DEVICE INCLUDING DATA TRANSFER BUS AND DATA TRANSFER METHOD OF THE DEVICE

(75) Inventor: Hiroshi Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 246 days.

(21) Appl. No.: 13/598,971

(22) Filed: Aug. 30, 2012

(65) Prior Publication Data

US 2013/0070543 A1 Mar. 21, 2013

(30) Foreign Application Priority Data

Sep. 21, 2011 (JP) .................................. 2011-205812

(51) Int. Cl.
  *G11C 7/00* (2006.01)
  *G11C 7/10* (2006.01)

(52) U.S. Cl.
  CPC ................ *G11C 7/10* (2013.01); *G11C 7/1069* (2013.01)
  USPC ............ 365/189.14; 365/189.05; 365/189.08; 365/230.03

(58) Field of Classification Search
  USPC ............ 365/189.14, 230.03, 63, 198, 189.05, 365/230.08, 189.08
  See application file for complete search history.

(56) References Cited

U.S. PATENT DOCUMENTS

| 6,418,066 B1 * | 7/2002 | Hidaka .......................... 365/198 |
| 7,421,557 B2 | 9/2008 | Lee et al. |
| 2004/0032790 A1 * | 2/2004 | Mori et al. ................ 365/230.03 |
| 2007/0206419 A1 | 9/2007 | Makino |

FOREIGN PATENT DOCUMENTS

| JP | 2002-93179 | 3/2002 |
| JP | 2005-285313 | 10/2005 |
| JP | 2007-242735 | 9/2007 |

* cited by examiner

*Primary Examiner* — Richard Elms
*Assistant Examiner* — Mohammed A Bashar
(74) *Attorney, Agent, or Firm* — Oblon, McClelland, Maier & Neustadt, L.L.P.

(57) ABSTRACT

According to one embodiment, a semiconductor memory device includes a memory cell array, a data bus, a transfer controller, column blocks, and a column selector. The data bus is divided into stages. The transfer controller serially transfers data such that the data are respectively allocated to the stages. The column blocks temporarily stores the data. The column selector selects a column block for each of the stages from the column blocks, and transfers the data parallel between the stages and the column blocks selected for the stages. The data bus extends from one end to the other in a direction in which the column blocks are arranged, and returns from the other end to the one end.

19 Claims, 7 Drawing Sheets

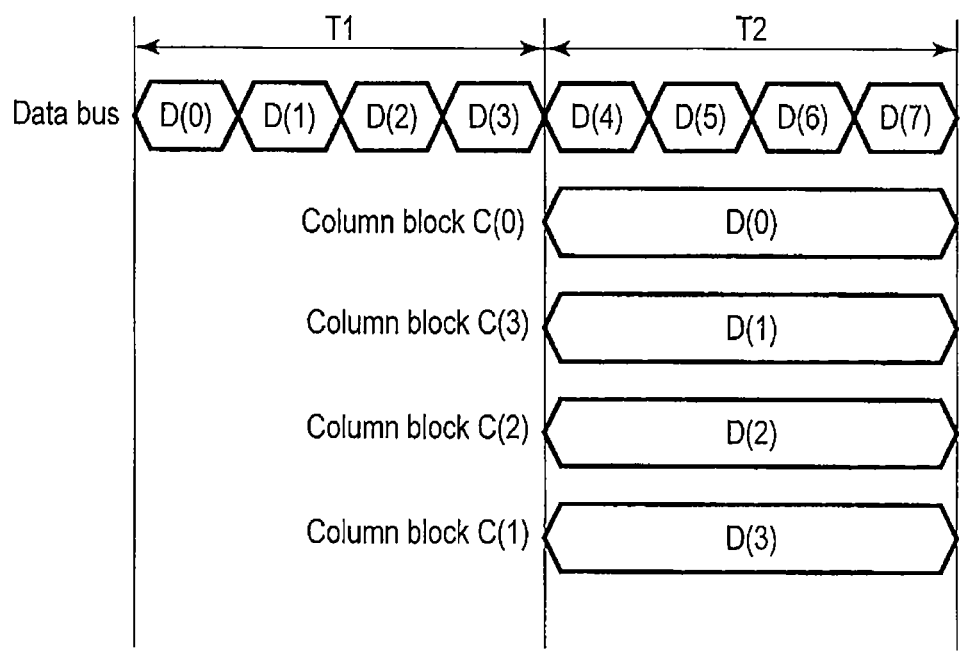
F I G. 3

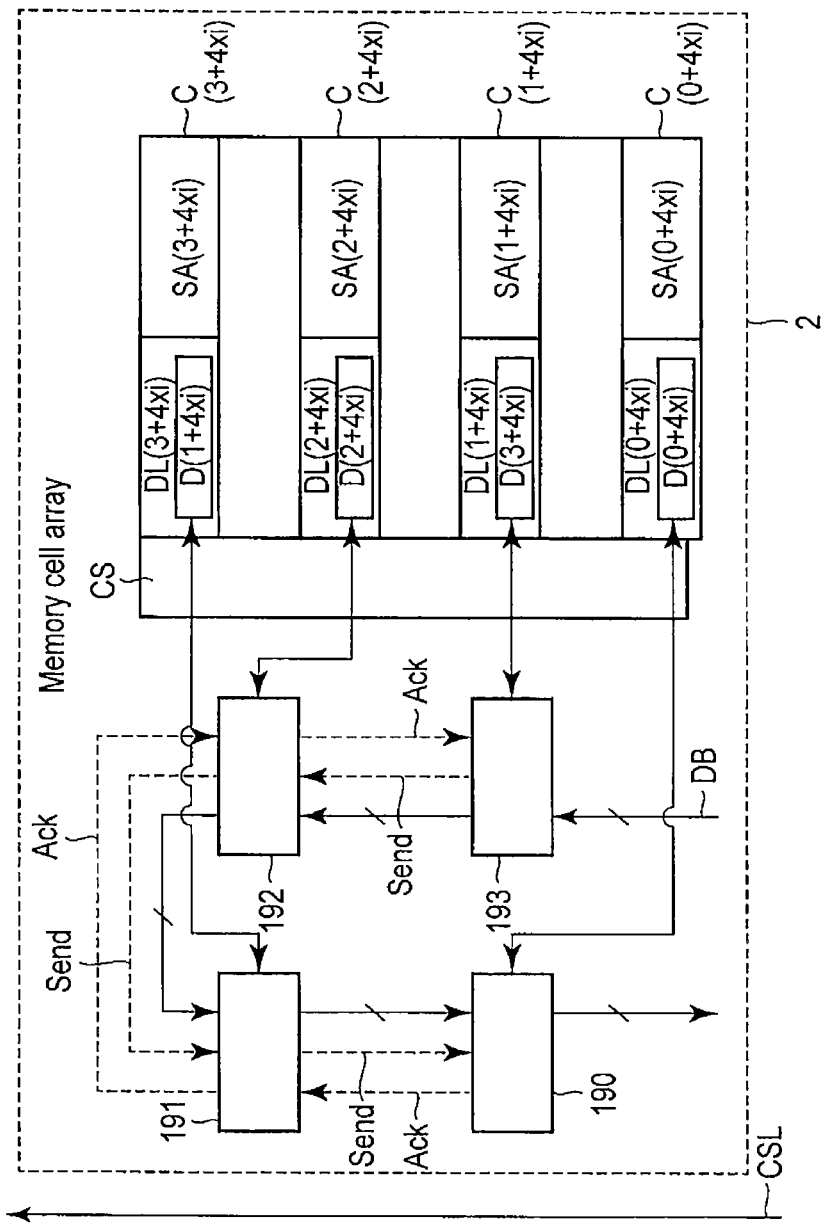
F I G. 7

SEMICONDUCTOR MEMORY DEVICE INCLUDING DATA TRANSFER BUS AND DATA TRANSFER METHOD OF THE DEVICE

CROSS-REFERENCE TO RELATED APPLICATIONS

This application is based upon and claims the benefit of priority from Japanese Patent Application No. 2011-205812, filed Sep. 21, 2011, the entire contents of which are incorporated herein by reference.

FIELD

Embodiments described herein relate generally to a semiconductor memory device and data transfer method of the device.

BACKGROUND

A flash memory is used as a file memory for saving data in an electronic device such as a computer or digital camera.

The bit cost of the flash memory has been reduced year by year by continuously increasing the capacity and advancing micropatterning. The number of applications of the flash memory has increased due to the increased capacity and scaling of the device dimension. Recently, the bit cost of the flash memory has been reduced by a bit cost scalable configuration (a three dimensional stracked array structure) in addition to the scaling of the device dimension and multilevel cell.

In the bit cost reducing technique like this, the signal amount of a cell basically reduces, and the capacity of a bit line for reading out a signal from the cell increases, so the read speed of each cell decreases. Also, to reduce the bit cost, it is necessary to finely perform a write operation and verify operation. This decreases the write speed as well.

A conventional semiconductor memory device incorporates a page register that allows high-speed read and write from an external device. The bit size of this page register is called a page length. The unit of read or write performed for memory cells at once is called a page. The bit size of the page is also called a page length. Data having the page length is read out or written at once between the page register and memory cells. The page length is much larger than the number of input/output bits of a memory chip. Accordingly, the semiconductor memory device can perform data transfer at high speed with an external device by obscuring slow operations of an internal memory cell array.

To process large amounts of stored data, it is necessary to improve the high-speed data access performance. The development of a speed increasing technique of increasing the bandwidth five to ten times, e.g., from 200 to 400 MBytes/sec has been advanced.

BRIEF DESCRIPTION OF THE DRAWINGS

FIG. 3 is a timing chart showing an example of a write operation according to the first embodiment;
FIG. 7 is a block diagram showing an example of data transfer control performed by transfer control circuits according to a second embodiment.

DETAILED DESCRIPTION

Figure 1:
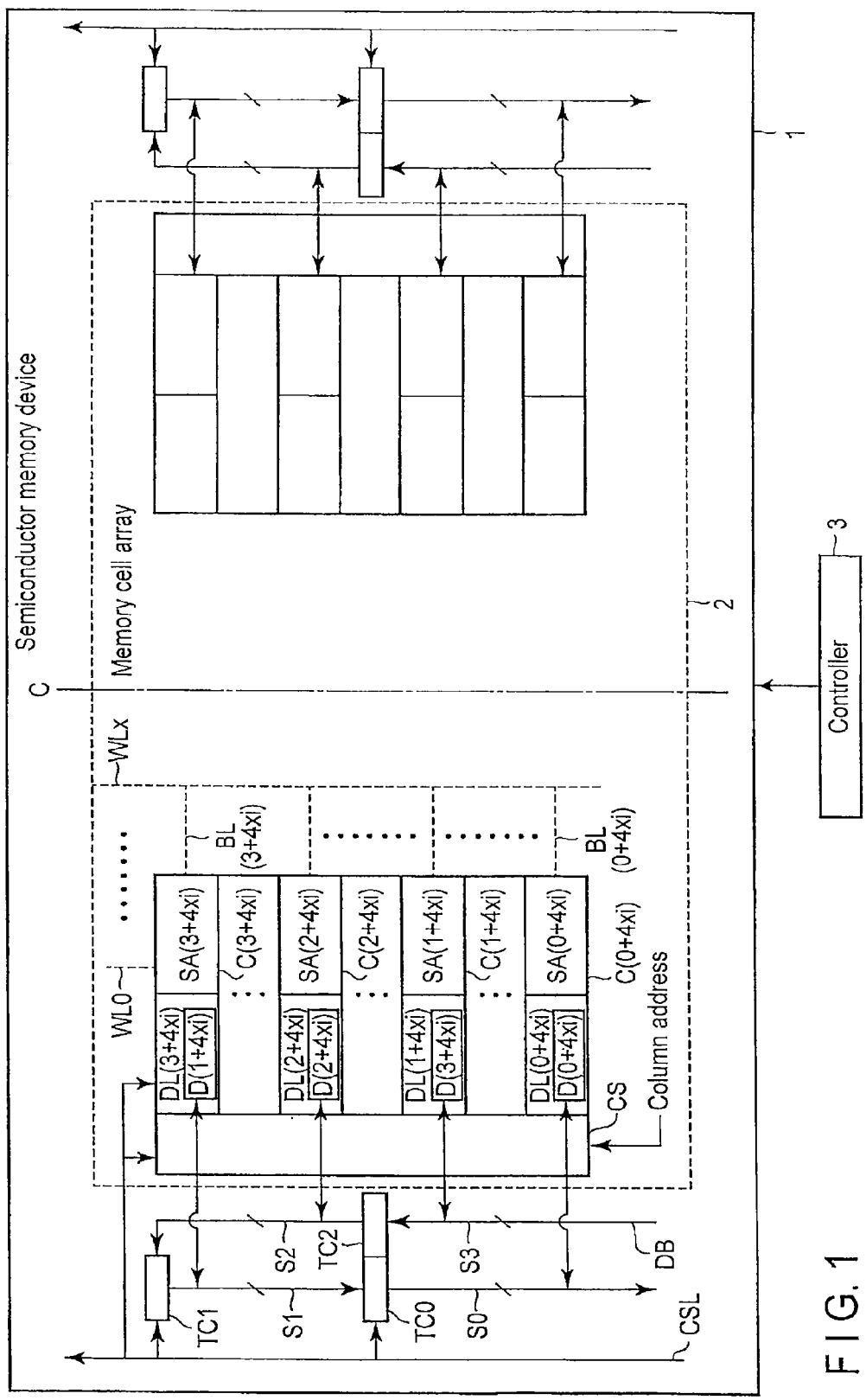
FIG. 1 is a plan block diagram showing an example of an arrangement of a semiconductor memory device according to a first embodiment.

In general, according to one embodiment, a semiconductor memory device includes a memory cell array, a data bus, a transfer controller, a plurality of column blocks, and a column selector. The data bus is divided into a plurality of stages. The transfer controller serially transfers data such that the data are respectively allocated to the plurality of stages. The plurality of column blocks temporarily stores the data. The column selector selects a column block for each of the plurality of stages from the plurality of column blocks, and transfers the data parallel between the plurality of stages and the column blocks selected for the plurality of stages. The data bus extends from one end to the other in a direction in which the plurality of column blocks are arranged, and returns from the other end to the one end.

Each embodiment of the present invention will be explained below with reference to the accompanying drawings. Note that in the following explanation, the same reference numerals or symbols denote almost or practically the same functions and constituent elements, and a repetitive explanation will be made as needed.

First Embodiment

In this embodiment, serial data transfer is performed by a data unit such as a page. In this embodiment, a bus for receiving readout data from an internal data latch (column register) or supplying write data to the data latch is divided into a plurality of stages, and a pipeline operation is performed. This embodiment thus implements large-band-width data transfer.

In this embodiment, the data transfer bus extends from one end to the other in a direction in which column blocks of a memory chip are arranged, and returns from the other end to the original end.

Although the data size of readout data and write data is a page size in this embodiment, the data size may also be larger or smaller than a page.

FIG. 1 is a plan block diagram showing an example of an arrangement of a semiconductor memory device according to this embodiment. A semiconductor memory device 1 may have an arrangement almost axially symmetrical with respect to a central line C in a plane. In the following description, the semiconductor memory device 1 will be explained based on the left-side arrangement shown in FIG. 1.

Figure 2:
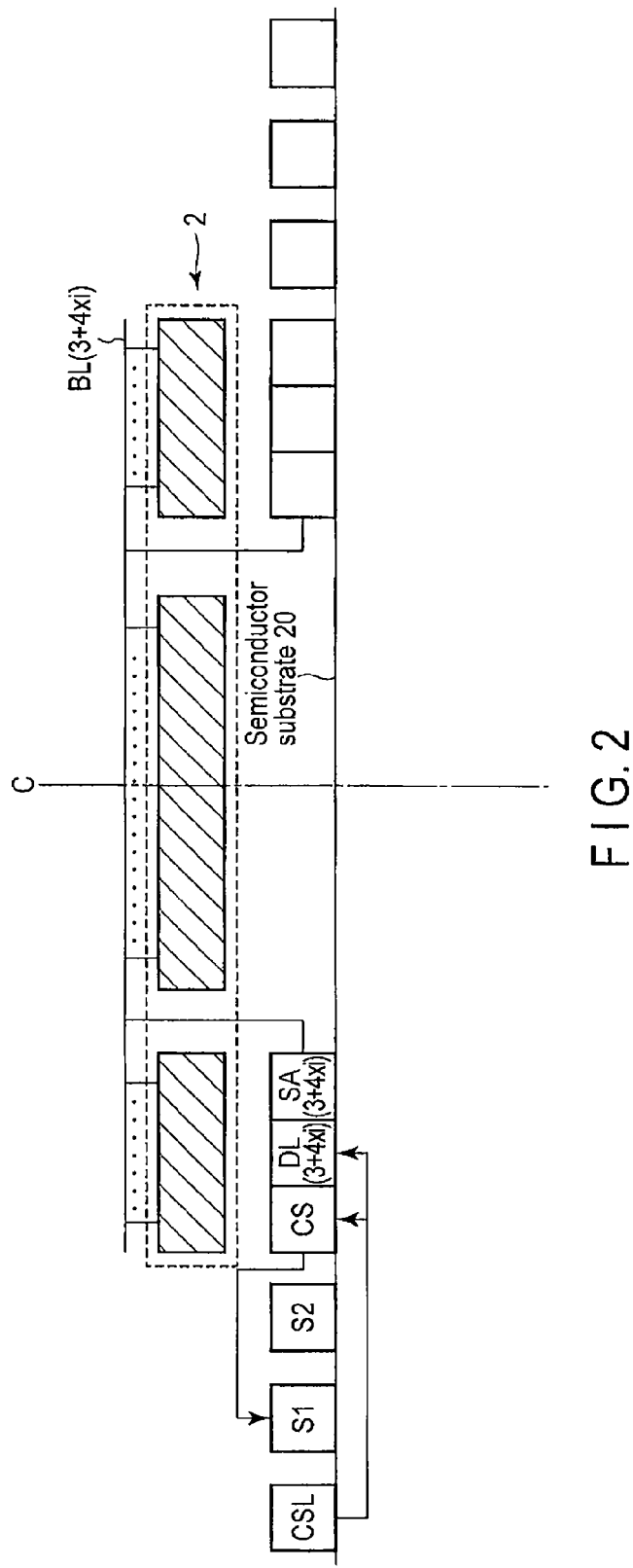
FIG. 2 is a sectional block diagram showing an example of an arrangement of the semiconductor memory device according to the first embodiment.

FIG. 2 is a sectional block diagram showing an example of the arrangement of the semiconductor memory device 1 according to this embodiment.

The semiconductor memory device 1 is, e.g., a bit cost scalable semiconductor memory device (a three dimensional stracked array structure device), and performs data read and write. The semiconductor memory device 1 includes a memory cell array 2, a plurality of column blocks C(0+4×0), ..., C(0+4×n), C(1+4×0), ..., C(1+4×n), C(2+4×0), ..., C(2+4×n), and C(3+4×0), ..., C(3+4×n), a column selector CS, a data bus DB, transfer control circuits TC0 to TC2, and a clock signal line CSL.

The memory cell array 2 is formed above at least part of circuits on a semiconductor substrate 20.

The plurality of column blocks $C(0+4\times0), \ldots, C(0+4\times n)$, $C(1+4\times0), \ldots, C(1+4\times n)$, $C(2+4\times0), \ldots, C(2+4\times n)$, and $C(3+4\times0), \ldots, C(3+4\times n)$ include an internal data latch and temporarily store data.

The plurality of column blocks $C(+4\times0), \ldots, C(0+4\times n)$, $C(1+4\times0), \ldots, C(1+4\times n)$, $C(2+4\times0), \ldots, C(2+4\times n)$, and $C(3+4\times0), \ldots, C(3+4\times n)$ are arranged in this order, for example, from one end to the other in a column block arrangement direction of the memory chip, wherein n is an integer of 1 or more. When i is an integer represented by $0 \leq i \leq n$ and r is one of 0, 1, 2, and 3, a reference symbol of a column block is expressed by $C(r+4\times i)$. In the reference symbol $C(r+4\times i)$ of the column block, the integer i changes from 0 to n when r=0, changes from 0 to n when r=1, changes from 0 to n when r=2, and finally changes from 0 to n when r=3.

Of the plurality of column blocks $C(0), \ldots, C(3+4\times n)$, FIG. 1 shows the column blocks $C(0+4\times i)$, $C(1+4\times i)$, $C(2+4\times i)$, and $C(3+4\times i)$.

A controller 3 controls the semiconductor memory device 1.

The data bus DB is divided into a plurality of stages S0 to S3 based on the transfer control circuits TC0 to TC2. In this embodiment, the plurality of stages S0 to S3 are arranged in series from the output side to the input side of the data bus DB.

The data bus DB extends from one end to the other in the direction in which the plurality of column blocks $C(0), \ldots, C(3+4\times n)$ are arranged, returns at the other end, and extends from the other end to the one end.

This embodiment will be explained by taking an arrangement in which the data bus DB is divided into the four stages S0 to S3 as an example. However, it is only necessary to divide the first half of the data bus DB which extends from one end to the other into two or more portions, and divide the second half of the data bus DB which returns from the other end to the one end into two or more portions, i.e., divide the data bus DB into four or more portions in total.

The memory cell array 2 and peripheral circuits such as the plurality of column blocks $C(0), \ldots, C(3+4\times n)$ and the column selector CS are stacked. More specifically, the memory cell array 2 is formed above the plane of the semiconductor substrate 20, and the peripheral circuits such as the plurality of column blocks $C(0), \ldots, C(3+4\times n)$ and the column selector CS are formed for the plane of the semiconductor substrate 20 below the memory cell array 2. That is, in this embodiment, the peripheral circuits may be formed between the memory cell array 2 and semiconductor substrate 20. Note that it is also possible to stack the memory cell array 2 and the controller 3, or stack the memory cell array 2 and the data bus DB and transfer control circuits TC0 to TC2, i.e., form the data bus DB and transfer control circuits TC0 to TC2 between the memory cell array 2 and semiconductor substrate 20.

The memory cell array 2 is, e.g., a NAND flash memory, a NOR flash memory, or another kind of a flash memory. The memory cell array 2 may also be a bit cost scalable cell array.

A plurality of memory cells of the memory cell array 2 are formed at the intersections of a plurality of word lines WL0 to WLx and a plurality of bit lines $BL0, \ldots, BL(3+4\times n)$.

The column blocks $C(0), \ldots, C(3+4\times n)$ include sense amplifiers $SA(0), \ldots, SA(3+4\times n)$, data latches (page registers) $DL(0), \ldots, DL(3+4\times n)$, an arithmetic circuit (not shown), and a control circuit (not shown), respectively. FIG. 1 shows the sense amplifiers $SA(0+4\times i)$, $SA(1+4\times i)$, $SA(+4\times i)$, and $SA(3+4\times i)$ of the sense amplifiers $SA(0), \ldots, SA(3+4\times n)$, and the data latches $DL(0+4\times i)$, $DL(1+4\times i)$, $DL(2+4\times i)$, and $DL(3+4\times i)$ of the data latches $DL(0), \ldots, DL(3+4\times n)$.

In this embodiment, the column blocks $C(0+4\times0), \ldots, C(0+4\times n)$ correspond to the stage S0, the column blocks $C(1+4\times0), \ldots, C(1+4\times n)$ correspond to the stage S3, the column blocks $C(2+4\times0), \ldots, C(2+4\times n)$ correspond to the stage S2, and the column blocks $C(3+4\times0), \ldots, C(3+4\times n)$ correspond to the stage S1.

The column selector CS selects column blocks as targets of parallel data read or write, for each of the stages S0 to S3.

The clock signal line CSL supplies a common clock signal to the column selector CS, column blocks $C(0), \ldots, C(3+4\times n)$, and transfer control circuits TC0 to TC2. The column selector CS, column blocks $C(0), \ldots, C(3+4\times n)$, and transfer control circuits TC0 to TC2 operate based on this clock signal.

The transfer control circuits TC0 to TC2 are formed between the stages S0 to S3, and serially transfer data $D(0+4\times0)$, $D(1+4\times0)$, $D(2+4\times0)$, $D(3+4\times0), \ldots, D(0+4\times n)$, $D(1+4\times n)$, $D(2+4\times n)$, and $D(3+4\times n)$ in this order from a preceding stage to a succeeding stage.

A reference symbol of data is expressed by $D(r+4\times i)$. In this data number $D(r+4\times i)$, r changes to 0, 1, 2, and 3 when i=0, changes to 0, 1, 2, and 3 when i=1, and changes to 0, 1, 2, and 3 when i=n. FIG. 1 shows the data $D(0+4\times i)$, $D(1+4\times i)$, $D(2+4\times i)$, and $D(3+4\times i)$ of the data $D(0)$, $D(1)$, $D(2)$, $D(3), \ldots, D(3+4\times n)$.

The transfer control circuits TC0 to TC2 set four data on the stages S0 to S3 by serial transfer within one write timing for the column blocks. Also, the transfer control circuits TC0 to TC2 output four data set to the stages S0 to S3 by serial transfer within one read timing for the column blocks.

For example, flip-flop circuits may be used as the transfer control circuits TC0 to TC2.

The transfer control circuits TC0 to TC2 serially transfer four data on the stages S0 to S3 between the timing at which data are stored in the data latches of four column blocks designated by column addresses, and the timing at which new data are stored in the data latches of four column blocks designated by new column addresses. That is, in this embodiment, one storage cycle of four data with respect to four data latches corresponds to four transfer cycles of the data bus DB.

The transfer control circuits TC0 to TC2, column selector CS, and column blocks $C(0), \ldots, C(3+4\times n)$ perform, e.g., a pipeline operation under the control of a common clock.

FIG. 3 is a timing chart showing an example of a write operation according to this embodiment.

The transfer control circuits TC0 to TC2 serially transfer data $D(0)$, $D(1)$, $D(2)$, and $D(3)$ within a write timing T1, and allocates the data $D(0)$, $D(1)$, $D(2)$, and $D(3)$ to the stages S0, S1, S2, and S3, respectively.

At a next write timing T2, the column selector CS transfers the data $D(0)$, $D(1)$, $D(2)$, and $D(3)$ allocated to the stages S0, S1, S2, and S3 parallel to the column blocks $C(0)$, $C(3)$, $C(2)$, and $C(1)$ designated (selected) by column addresses in the stages S0, S1, S2, and S3.

Also, at the write timing T2, the transfer control circuits TC0 to TC2 serially transfer new data $D(4)$, $D(5)$, $D(6)$, and $D(7)$, and allocate the data $D(4)$, $D(5)$, $D(6)$, and $D(7)$ to the stages S0, S1, S2, and S3, respectively. A write operation after that is the same as described above. In this write operation, the data $D(0+4\times i)$, $D(1+4\times i)$, $D(2+4\times i)$, and $D(3+4\times i)$ are respectively allocated from the stages S0, S1, S2, and S3 to the column blocks $C(0+4\times i)$, $C(3+4\times i)$, $C(2+4\times i)$, and $C(1+4\times i)$.

Figure 4:
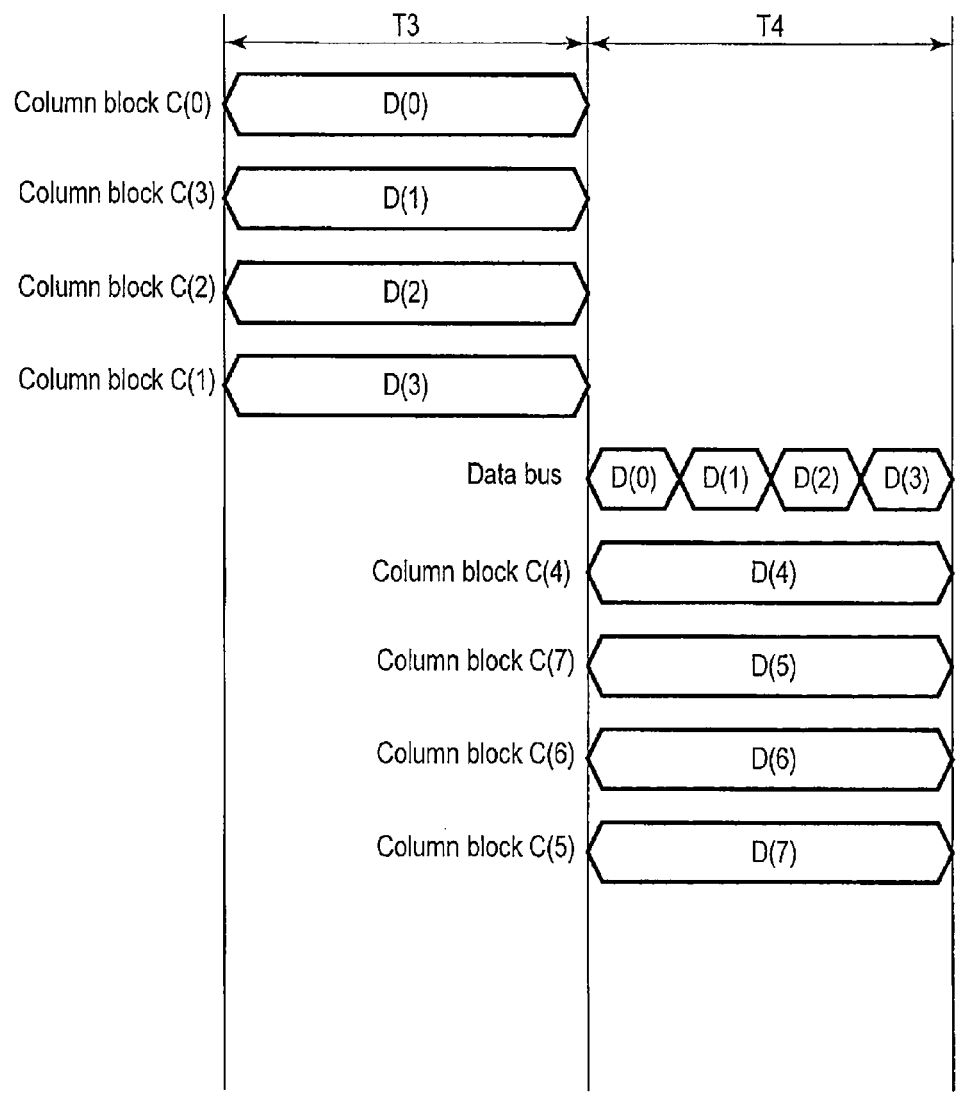
FIG. 4 is a timing chart showing an example of a read operation according to the first embodiment.

FIG. 4 is a timing chart showing an example of a read operation according to this embodiment.

At a read timing T3, the column blocks C(0), C(3), C(2), and C(1) designated (selected) by column addresses on the stages S0, S1, S2, and S3 respectively receive the data D(0), D(1), D(2), and D(3) read out from the memory cell array 2. The column selector CS allocates the data D(0), D(1), D(2), and D(3) received by the column blocks C(0), C(3), C(2), and C(1) to the stages S0, S1, S2, and S3, respectively, by parallel transfer.

At a read timing T4, the transfer control circuits TC0 to TC2 serially (sequentially) transfer the data D(0), D(1), D(2), and D(3) allocated to the stages S0, S1, S2, and S3. At the read timing T4, the column blocks C(4), C(7), C(6), and C(5) designated (selected) by new column addresses respectively receive next data D(4), D(5), D(6), and D(7) read out from the memory cell array 2. The read operation after that is the same as described above. In this read operation, the data D(0+4×i), D(1+4×i), D(2+4×i), and D(3+4×i) are respectively allocated from the column blocks C(0+4×i), C(3+4×i), C(2+4×i), and C(1+4×i) to the stages S0, S1, S2, and S3.

A conventional semiconductor memory device will be explained below in comparison to the semiconductor memory device 1 of this embodiment.

Figure 5:
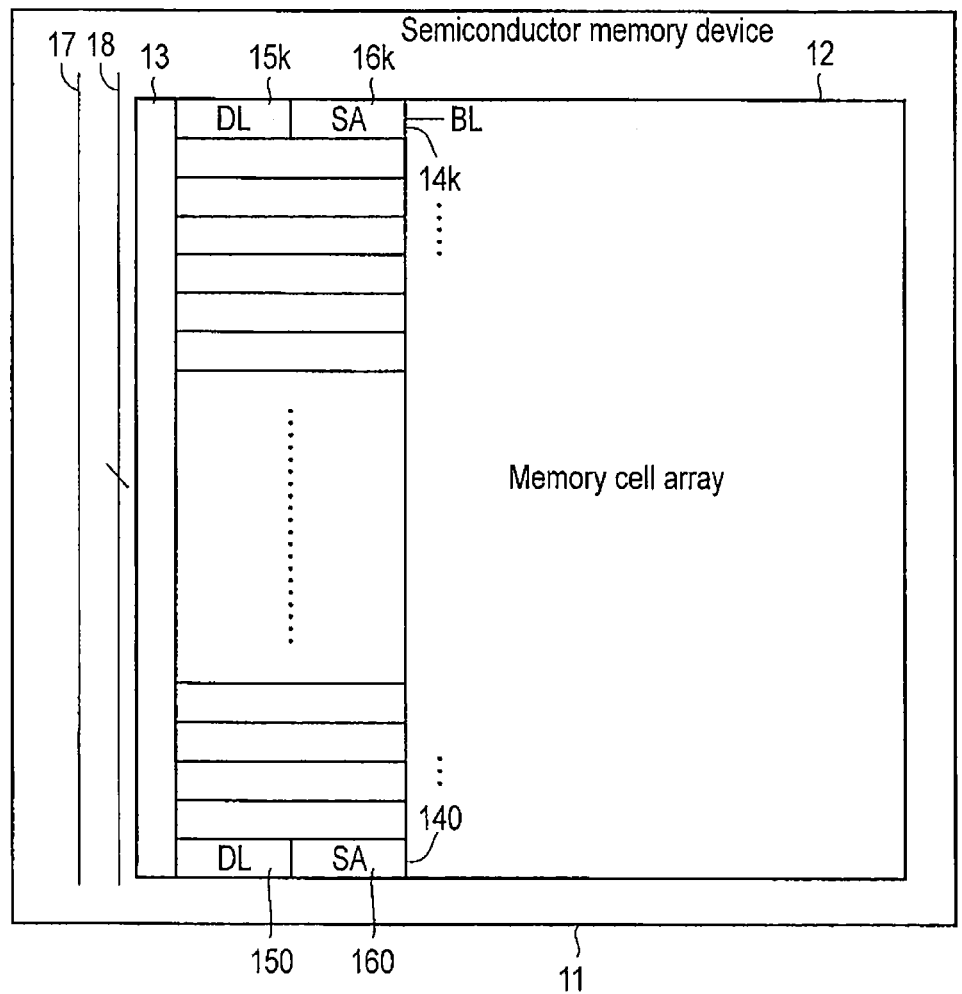
FIG. 5 is a block diagram showing an example of an outline of an arrangement of a conventional semiconductor memory device.

FIG. 5 is a block diagram showing an example of an outline of the arrangement of the conventional semiconductor memory device.

A semiconductor memory device 11 includes a memory cell array 12, a column selector 13, and a plurality of column blocks 140 to 14k. The plurality of column blocks 140 to 14k include data latches 150 to 15k and sense amplifiers 160 to 16k respectively, and hold write data and readout data.

The column selector 13 selects a specific column block designated by a column address according to each block cycle of a clock signal line 17, and stores data of a data bus 18 in a specific data latch in turn. When the semiconductor memory device 11 is a large-capacity file memory, the number of column blocks 140 to 14k increases, and the data bus 18 becomes longer. This makes high-speed data transfer difficult. Also, when the semiconductor memory device 11 is a bit cost scalable semiconductor memory device, the bit cost can further be decreased by forming the memory cell array 12 in a layer above transistors, and forming peripheral circuits such as the column selector 13 and column blocks 140 to 14k below the memory cell array 12. However, if the memory cell array 12 is formed above the peripheral circuits, the connection between a low-resistance global interconnection formed above the memory cell array 12 and the peripheral circuits below the memory cell array 12 is limited. This makes it difficult to perform high-speed data transfer from the low-resistance global interconnection to the peripheral circuits below the memory cell array 12.

Figure 6:
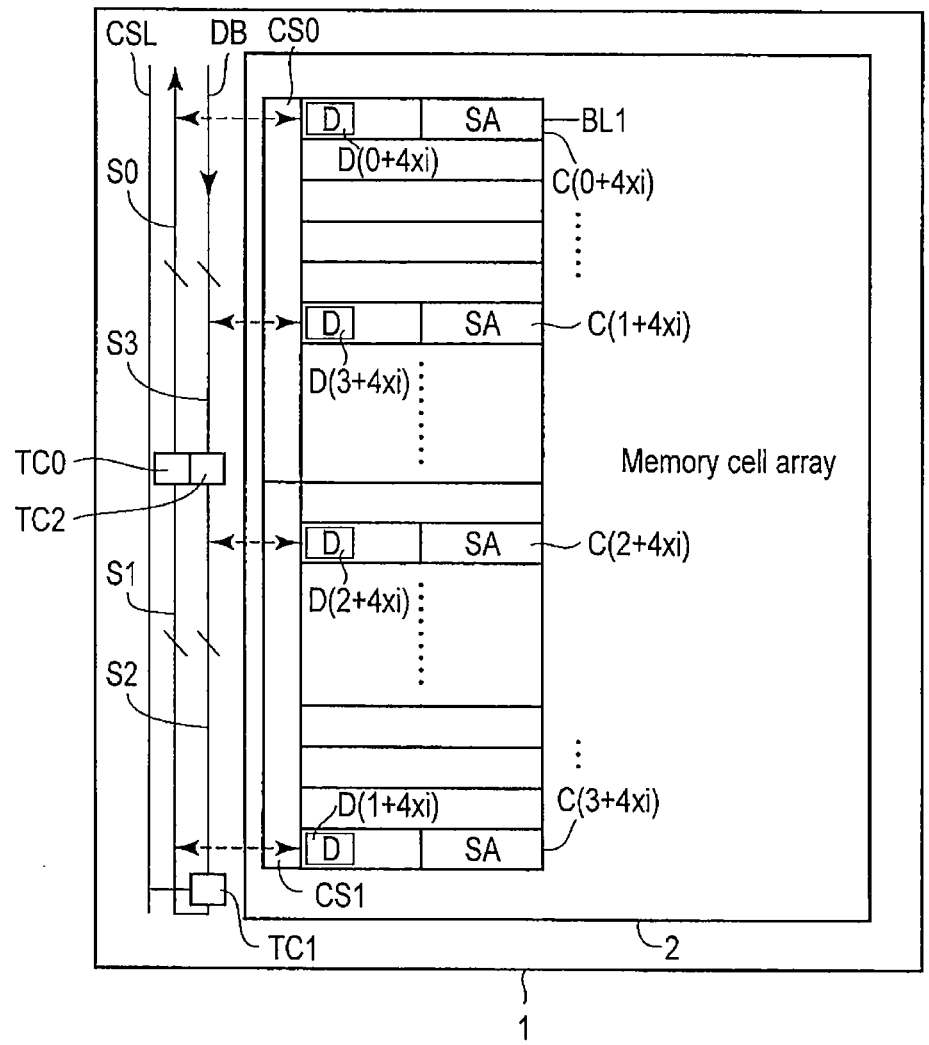
FIG. 6 is a block diagram showing an example of an outline of an arrangement of the semiconductor memory device according to the first embodiment.

FIG. 6 is a block diagram showing an example of an outline of the arrangement of the semiconductor memory device 1 according to this embodiment. Note that FIG. 6 shows only the column blocks C(0+4×i), C(1+4×i), C(2+4×i), and C(3+4×i) of the column blocks C(0), . . . , C(3+4×n), as in FIG. 1 described above.

As described above, it is difficult for the semiconductor memory device 11 shown in FIG. 5 to perform high-speed data transfer. By contrast, in this embodiment, even when it is difficult to increase the operation speed of the circuits arranged below the memory cell array 2, pipeline processing is applied to correct a difference between the circuits arranged below the memory cell array 2 and external high-speed data transfer.

In the semiconductor memory device 1 according to this embodiment, the data bus DB for transferring the data D(0+4×0), . . . , D(3+4×n) to the data latches DL(0+4×0), . . . , DL(0+4×n), DL(1+4×0), . . . , DL(1+4×n), DL(2+4×0), . . . , DL(2+4×n), and DL(3+4×0), . . . , DL(3+4×n) is divided into the stages S0 to S3, and a pipeline operation is performed for the plurality of stages S0 to S3.

The data bus DB extends from one end to the other end of a memory cell array (memory chip), returns at the other end, and extends from the other end to the one end.

Since the data bus DB is divided into the short stages S0 to S3, high-speed data transfer can be performed.

The transfer control circuits TC0 to TC2 divide the data bus DB into two stages in each of a portion extending from one end to the other and a portion returning from the other end to the one end, i.e., into a total of four stages. The transfer control circuits TC0 to TC2 is controlled using a clock from the clock signal line CSL. The stages S0 to S3 store the data D(0+4×i), D(1+4×i), D(2+4×i), and D(3+4×i) in the data latches DL(0+4×i), DL(3+4×i), DL(2+4×i), and DL(1+4×i) or read out the data D(0+4×i), D(1+4×i), D(2+4×i), and D(3+4×i) from the data latches DL(0+4×i), DL(3+4×i), DL(2+4×i), and DL(1+4×i) parallel by a pipeline operation.

A column selector CS0 selects specific column blocks in turn for the stages S0 and S3, and stores data of the stages S0 and S3 in specific data latches in turn, or provides data stored in the specific data latches for the stages S0 and S3, for every four cycles. A column selector CS1 selects specific column blocks in turn for the stages S1 and S2, and stores data of the stages S1 and S2 in specific data latches in turn, or provides data stored in the specific data latches for the stages S1 and S2, for every four cycles. That is, the column selector CS0 receives data from the stages S0 and S3 or provides data for the stages S0 and S3. The column selector CS1 receives data from the stages S1 and S2 or provides data for the stages S1 and S2.

Since the column blocks C(0), . . . , C(3+4×n) operate parallel, they can operate by the number of cycles four times that when no pipeline operation is performed.

In addition, in this embodiment, the length of one stage of the data bus DB in the column block arrangement direction is half that of the data bus 18 of the conventional semiconductor memory device 11. Therefore, the RC time constant of the data bus DB is ¼ that of the conventional data bus 18. Accordingly, even when the resistance per unit length of the interconnection of an internal data bus is high or the capacitance is large, it is possible to correspond to a large bandwidth of an external data bus.

Note that in this embodiment, the clock signal line CSL is not divided unlike the data bus DB. To prevent a clock delay, therefore, a low-resistance global interconnection or the like is desirably applied as the clock signal line CSL.

In the semiconductor memory device 1 according to this embodiment explained above, the data bus DB for transferring data to the internal data latches DL(0+4×0), . . . , DL(0+4×n), DL(1+4×0), . . . , DL(1+4×n), DL(2+4×0), . . . , DL(2+4×n), and DL(3+4×0), . . . , DL(3+4×n) is divided into the stages S0 to S3. In this embodiment, write from the stages S0 to S3 to the data latches DL(0+4×0), . . . , DL(3+4×n) and read from the data latches DL(0+4×0), . . . , DL(3+4×n) to the stages S0 to S3 are implemented by a pipeline operation. Accordingly, data transfer can be performed with a large bandwidth.

In this embodiment, the data bus DB has a returning structure. This makes it possible to transfer data in one direction in the data bus DB, and continuously perform a pipeline operation.

Second Embodiment

The above-mentioned first embodiment includes the transfer control circuits TC0 to TC2 controlled by a clock, as circuits for dividing the data bus DB into the stages S0 to S3.

By contrast, transfer control circuits according to this embodiment control data transfer by exchanging (handshaking) a transmission notification signal Send and acknowledgement signal Ack.

FIG. 7 is a block diagram showing an example of data transfer control performed by transfer control circuits according to this embodiment.

Transfer control circuits 190 to 193 according to this embodiment respectively correspond to stages S0 to S3. The transfer control circuits 190 to 193 are, e.g., asynchronous self-timing data transfer circuits. Adjacent transfer control circuits exchange data, the transmission notification signal Send, and acknowledgement signal Ack.

Data transfer control executed by the transfer control circuits 190 to 193 will be explained by using the first transfer control circuit 193, second transfer control circuit 192, and third transfer control circuit 191.

The first transfer control circuit 193 corresponding to the stage S3 transfers data to the second transfer control circuit 192 corresponding to the stage S2, and transfers the transmission notification signal Send indicating the transmission of the data to the second transfer control circuit 192.

The second transfer control circuit 192 receives the data transferred from the first transfer control circuit 193, and returns the acknowledgement signal Ack to the first transfer control circuit 193. Also, the second transfer control circuit 192 transfers the data to the third transfer control circuit 191, and transfers the transmission notification signal Send to the third transfer control circuit 191.

The first transfer control circuit 193 having received the acknowledgement signal Ack from the second transfer control circuit 192 stops transmitting the transmission notification signal Send to the second transfer control circuit 192.

Adjacent transfer control circuits alternately handshake the transmission notification signal Send and acknowledgement signal Ack, thereby performing an asynchronous pipeline operation.

The transfer control circuits 190 to 193 according to this embodiment require no clock from a global clock signal line CSL. Therefore, even when a data bus DB and the transfer control circuits 190 to 193 are arranged below a memory cell array 2 and the use of a low-resistance interconnection is restricted, high-speed data transfer can be performed by using a pipeline operation.

In this embodiment, the necessary area of the semiconductor memory device can be reduced by arranging the data bus DB and transfer control circuits 190 to 193 below the memory cell array 2.

In this embodiment explained above, data transfer for a pipeline operation is asynchronously performed at a self-timing. This makes it possible to transfer data with a large bandwidth even in a high-interconnection-resistance environment below the memory cell array 2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory cell array;
a data bus which is divided into a plurality of stages;
a transfer controller which serially transfers data such that the data are respectively allocated to the plurality of stages;
a plurality of column blocks which temporarily stores the data; and
a column selector which selects a column block for each of the plurality of stages from the plurality of column blocks, and transfers the data parallel between the plurality of stages and the column blocks selected for the plurality of stages,
wherein the data bus extends from one end to the other in a direction in which the plurality of column blocks are arranged, and returns from the other end to the one end,
in a write operation, a plurality of write data are serially transferred by the data bus, and transmitted parallel from the plurality of stages to the plurality of selected column blocks, and
in a read operation, a plurality of readout data are transferred parallel from the plurality of selected column blocks to the plurality of stages, and serially transferred by the data bus.

2. The device according to claim 1, wherein
the transfer controller comprises a plurality of transfer circuits which divide the data bus into the plurality of stages, and
the plurality of transfer circuits serially transfer the data of the plurality of stages of the data bus based on a common clock signal.

3. The device according to claim 2, wherein
the plurality of transfer circuits are a plurality of flip-flop circuits which divide the data bus into the plurality of stages.

4. The device according to claim 1, wherein
the transfer controller comprises a plurality of transfer circuits corresponding to the plurality of stages, and
in the plurality of transfer circuits, a preceding transfer circuit transmits the data and a transmission notification signal to a succeeding transfer circuit following the preceding transfer circuit, and the succeeding transfer circuit returns an acknowledgement signal to the preceding transfer circuit, thereby controlling the serial transfer.

5. The device according to claim 1, wherein
the memory cell array is formed above a semiconductor substrate, and
the plurality of column blocks and the column selector are formed between the semiconductor substrate and the memory cell array.

6. The device according to claim 5, wherein the data bus and the transfer controller are formed between the semiconductor substrate and the memory cell array.

7. The device according to claim 1, wherein
at a first write timing, the transfer controller allocates the data to the plurality of stages by serial transfer,
at a second write timing following the first write timing, the column selector transfers the data allocated to the plurality of stages parallel to column blocks selected for the plurality of stages, and
at the second write timing, the transfer controller allocates next data to the plurality of stages by serial transfer.

8. The device according to claim 1, wherein
at a first read timing, column blocks selected for the plurality of stages receive data read out from the memory cell array, and the column selector transfers the data received by the selected column blocks parallel to the plurality of stages, at a second read timing following the first read timing, the transfer controller serially transfers data allocated to the plurality of stages, and at the second timing, column blocks newly selected for the plurality of stages receive next data read out from the memory cell array.

9. A data transfer method of a semiconductor memory device, wherein the semiconductor memory device comprises:

a memory cell array;

a data bus which is divided into a plurality of stages;

a transfer controller which serially transfers data such that the data are allocated to the plurality of stages, respectively;

a plurality of column blocks which temporarily store the data; and a column selector which selects a column block for each of the plurality of stages from the plurality of column blocks, and transfer the data parallel between the plurality of stages and the column blocks selected for the plurality of stages, the data bus extends from one end to the other in a direction in which the plurality of column blocks are arranged, and returns from the other end to the one end, and the data transfer method comprises:

in a write operation, serially transferring a plurality of write data by the data bus, and transmitting the plurality of write data parallel from the plurality of stages to the plurality of selected column blocks; and in a read operation, transferring a plurality of readout data parallel from the plurality of selected column blocks to the plurality of stages, and serially transferring the plurality of readout data by the data bus.

10. The method according to claim 9, wherein the transfer controller comprises a plurality of transfer circuits which divide the data bus into the plurality of stages, and the plurality of transfer circuits serially transfer the data of the plurality of stages of the data bus based on a common clock signal.

11. The method according to claim 9, wherein the transfer controller comprises a plurality of transfer circuits corresponding to the plurality of stages, and in the plurality of transfer circuits, a preceding transfer circuit transmits the data and a transmission notification signal to a succeeding transfer circuit following the preceding transfer circuit, and the succeeding transfer circuit returns an acknowledgement signal to the preceding transfer circuit, thereby controlling the serial transfer.

12. The method according to claim 9, wherein at a first write timing, the transfer controller allocates the data to the plurality of stages by serial transfer, at a second write timing following the first write timing, the column selector transfers the data allocated to the plurality of stages parallel to column blocks selected for the plurality of stages, and at the second write timing, the transfer controller allocates next data to the plurality of stages by serial transfer.

13. The method according to claim 9, wherein at a first read timing, column blocks selected for the plurality of stages receive data read out from the memory cell array, and the column selector transfers the data received by the selected column blocks parallel to the plurality of stages, at a second read timing following the first read timing, the transfer controller serially transfers data allocated to the plurality of stages, and at the second timing, column blocks newly selected for the plurality of stages receive next data read out from the memory cell array.

14. A semiconductor memory device comprising:

a cell array including memory cells;

bit lines including sets of bit lines, each of the sets of bit lines including bit lines of the same number, the sets of bit lines respectively transferring data units to or from the memory cells, the data units having the same size;

a data bus;

a transfer controller which serially transfers data by the data bus;

a plurality of circuit blocks which respectively store the data units to or from the sets of bit lines, the circuit blocks being arranged in a first direction; and a selector which selects a plurality of circuit blocks from the circuit blocks to transfer the data units parallel between the selected circuit blocks and the data bus, wherein first data units are input in a first order to the data bus at a first end in the first direction, and the first data units transferred from selected circuit blocks are output from the data bus in the first order at the first end.

15. The device according to claim 14, wherein the data bus extends from the first end to a second end opposite the first end along the first direction, and returns from the second end to the first end.

16. The device according to claim 14, wherein in a write operation, data units which are among the data units and are to be written into the memory cells are serially transferred by the data bus, and transmitted parallel from the stages to the selected circuit blocks, and in a read operation, data units which are among the data units and read from the memory cells are transferred parallel from the selected circuit blocks to the stages, and serially transferred by the data bus.

17. The device according to claim 16, wherein the data bus has a plurality of stages, and the selector selects one of the circuit blocks for each of the stages.

18. The device according to claim 14, wherein the device stores data in the memory cells in non-volatile manner.

19. The device according to claim 17, wherein the device is a NAND flash memory device.

* * * * *